US010199560B2

United States Patent
Sirbuly et al.

(10) Patent No.: US 10,199,560 B2
(45) Date of Patent: Feb. 5, 2019

(54) PIEZOELECTRIC NANOPARTICLE-POLYMER COMPOSITE STRUCTURE

(71) Applicant: The Regents of the University of California, Oakland, CA (US)

(72) Inventors: Donald J. Sirbuly, Carlsbad, CA (US); William R. McCall, Woodside, CA (US); Kanguk Kim, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 233 days.

(21) Appl. No.: 14/974,582

(22) Filed: Dec. 18, 2015

(65) Prior Publication Data

US 2016/0181506 A1    Jun. 23, 2016

Related U.S. Application Data (60) Provisional application No. 62/093,927, filed on Dec. 18, 2014.

(51) Int. Cl.
| | |
|---|---|
| *B29C 67/20* | (2006.01) |
| *B29K 75/00* | (2006.01) |
| *B29K 83/00* | (2006.01) |
| *H01L 41/37* | (2013.01) |
| *B29K 105/00* | (2006.01) |
| *B29K 105/16* | (2006.01) |
| *H01L 41/18* | (2006.01) |

(52) U.S. Cl.
CPC .......... *H01L 41/183* (2013.01); *B29C 67/202* (2013.01); *H01L 41/37* (2013.01); *B29K 2075/00* (2013.01); *B29K 2083/00* (2013.01); *B29K 2105/002* (2013.01); *B29K 2105/167* (2013.01); *B29K 2995/0003* (2013.01)

(58) Field of Classification Search
CPC ..... H01L 41/183; H01L 41/37; B29C 67/202; B29K 2075/00; B29K 2105/0002; B29K 2105/167; B29K 2083/00; B29K 2995/0603
See application file for complete search history.

(56) References Cited

U.S. PATENT DOCUMENTS

| | | | |
|---|---|---|---|
| 8,310,134 B2* | 11/2012 | Ajayan | H01L 41/113 310/357 |
| 2011/0281150 A1* | 11/2011 | Yong | C08J 5/18 429/144 |
| 2014/0260653 A1* | 9/2014 | Merrell | G01L 1/16 73/774 |

(Continued)

OTHER PUBLICATIONS

McCall et al, "piezoelectric Nanoparticle-Polymer Composite Foams", ACS Applied Materials & Interfaces, 2014, 6, pp. 19504-19509, Oct. 29, 2014.*

(Continued)

*Primary Examiner* — C Melissa Koslow
(74) *Attorney, Agent, or Firm* — Perkins Coie LLP (57) ABSTRACT

Methods, systems, and devices are disclosed for implementing a stretchable nanoparticle-polymer composite foams that exhibit piezoelectric properties. In one aspect, a nanoparticle-polymer composite structure includes a curable liquid polymer; piezoelectric nanoparticles; and graphitic carbons.

26 Claims, 9 Drawing Sheets

(56) References Cited

U.S. PATENT DOCUMENTS

2016/0163959 A1* 6/2016 Merrell ............... G01L 1/16
73/768

OTHER PUBLICATIONS

Supporting Information for McCall et al, "piezoelectric Nanoparticle-Polymer Composite Foams", ACS Applied Materials & Interfaces, 2014, 6, pp. 19504-19509, Oct. 29, 2014.*

Allahverdi et al., "Processing of Advanced Electroceramic Components by Fused Deposition Technique", J. Eur. Ceram. Soc. 2001, 21, pp. 1485-1490.

Arai et al., "Properties of Hydrophone with Porous Piezoelectric Ceramics", Japanese Journal of Applied Physics, 1991, pp. 2253-2255.

Bast et al., "The Influence of Internal Voids with 3-1 Connectivity on the Properties of Piezoelectric Ceramics Prepared by a New Planar Process", Ferroelectrics 1989, 94, 229-242.

Cha et al., "Porous PVDF as Effective Sonic Wave Driven Nanogenerators", Nano Lett. 2011, 11, pp. 5142-5147.

Chang et al., "Direct-Write Piezoelectric Polymeric Nanogenerator with High Energy Conversion Efficiency", Nano Lett. 2010, 10, pp. 726-731.

Choi, S. et al, "A polydimethylsiloxane (PDMS) sponge for the selective absorption of oil from water", ACS Appl. Mater. Interfaces 3, 2011, pp. 4552-4556.

Diaz et al., "A Semi-Quantitative Tribo-Electric Series for Polymeric Materials: The Influence of Chemical Structure and Properties", J. Electrostatics 2004, 62, pp. 277-290.

Fan et al., "Transparent Triboelectric Nanogenerators and Self-Powered Pressure Sensors Based on Micropatterned Plastic Films", Nano Lett. 2012, 12, pp. 3109-3114.

Foster et al., "A History of Medical and Biological Imaging with Polyvinylidene Fluoride (PVDF) Transducers", IEEE Trans. Ultrason. Eng. 2000, 47, pp. 1363-1371.

Hansen et al., "Hybrid Nanogenerator for Concurrently Harvesting Biomechanical and Biochemical Energy", ACS Nano 2010, 4, pp. 3647-3652.

Harris et al., "The Impact of Piezoelectric PVDF on Medical Ultrasound Exposure Measurements, Standards, and Regulations", IEEE Trans. Ultrason. Eng. 2000, 47, pp. 1321-1335.

Hu et al., "Regular Arrays of Highly Ordered Ferroelectric Polymer Nanostructures for Non-Volatile Low-Voltage Memories", Nature Mater. 2009, 8, pp. 62-67.

Kara et al., "Porous PZT Ceramics for Receiving Transducers", IEEE Trans. Ultrason. Eng. 2003, 50, pp. 289-296.

Kawai, H., "Piezoelectricity of Poly (Vinylidene Fluoride)", Jpn. J. Appl. Phys. 1969, 8, pp. 975-976.

Kim et al., "3D Optical Printing of Piezoelectric Nanoparticle-Polymer Composite Materials", ACS Nano 2014, pp. 799-9806.

Lee, H.W. et al, "Synthesis and Size Control of Tetragonal Barium Titanate Nanopowders by Facile Solvothermal Method", J. Am. Ceram. Soc. 2012, 95, pp. 2429-2434.

McCall, W. et al, "Piezoelectric Nanoparticle—Polymer Composite Foams", ACS Appl. Mater. Interfaces, 2014, 6 (22), pp. 19504-19509.

Nguyen et al., "Piezoelectric Nanoribbons for Monitoring Cellular Deformations", Nat. Nanotechnol. 2012, 7, pp. 387-593.

Park et al., "Rapid Removal of Organics and Oil Spills from Waters Using Silicone Rubber "Sponges"", J. Dispersion Sci. Technol. 2009, 30, pp. 318-327.

Park et al, "Flexible Nanocomposite Generator Made of BaTiO3 Nanoparticles and Graphitic Carbons", Adv. Mater. 2012, 24, pp. 2999-3004.

Peng, S. et al, "Controlling Morphology and Porosity of Porous Siloxane Membranes through Water Content of Precursor Microemulsion", Soft Matter 2012, 8, pp. 10493-10501.

Persano et al., "High Performance Piezoelectric Devices Based on Aligned Arrays of Nanofibers of Poly (Vinylidenefluoride-Co-Trifluoroethylene)", Nat. Commun. 2013, 4, pp. 1-10.

Qi et al., "Piezoelectric Ribbons Printed onto Rubber for Flexible Energy Conversion", Nano Lett. 2010, 10, pp. 524-528.

Rittenmyer et al., Piezoelectric 3-3 Composites:, Ferroelectrics 1982, 41, pp. 189-195.

Sirohi, J. et al, "Fundamental Understanding of Piezoelectric Strain Sensors", J. Intell. Mater. Sys. Struct. 2000, 11, pp. 246-257.

Takahashi et al., "Lead-Free Barium Titanate Ceramics with Large Piezoelectric Constant Fabricated by Microwave Sintering", Jpn. J. Appl. Phys., Part 2 2006, 45, pp. L30-L32.

Tuttle et al., "Robocast Pb(Zr0.95Ti0.05)O3 Ceramic Monoliths and Composites", J. Am. Ceram. Soc. 2001, 84, pp. 872-874.

Wada et al., "Enhanced Piezoelectric Properties of Barium Titanate Single Crystals with Different Engineered-Domain Sizes", J. Appl. Phys. 2005, 98, pp. 014109-1-014109-7.

Wang et al., "Matrix-Assisted Energy Conversion in Nanostructured Piezoelectric Arrays", Nano Lett. 2010, 10, pp. 4901-4907.

Wang, Z. L., "Progress in Piezotronics and Piezo-Phototronics", Adv. Mater. 2012, 24, pp. 4632-4646.

Wang, Z. L., "Self-Powered Nanosensors and Nanosystems", Adv. Mater. 2012, 24, pp. 280-285.

Wang et al., "Development of a PVDF Piezopolymer Sensor for Unconstrained in-Sleep Cardiorespiratory Monitoring", J. Intell. Mater. Syst. Struct. 2003, 14, pp. 185-190.

Xu et al., "Piezoelectric-Nanowire-Enabled Power Source for Driving Wireless Microelectronics", Nat. Commun. 2010, 1, pp. 1-5.

Xu et al., "Self-Powered Nanowire Devices", Nat. Nanotechnol. 2010, 5, pp. 366-373.

Zhang et al., "Poly(Dimethylsiloxane) Oil Absorbent with a Three-Dimensionally Interconnected Porous Structure and Swellable Skeleton", ACS Appl. Mater. Interfaces 2013, 5, pp. 10201-10206.

* cited by examiner

| Sample | Sugar:Composite Resin (g:g) | $\rho_{dry}$ (g/cm³) | $\rho_{wet}$ (g/cm³) | $\phi$ [%] |
|---|---|---|---|---|
| 1 | 1.8 | 0.489 | 0.8753 | 48.8 |
| 2 | 2.4 | 0.2933 | 0.7846 | 62.04 |
| 3 | 2.8 | 0.2462 | 0.7473 | 63.32 |
| 4 | 3.2 | 0.2638 | 0.7917 | 66.67 |
| 5 | 3.6 | 0.2085 | 0.8133 | 71.88 |
| 6 | 4 | 0.2154 | 0.7471 | 73.04 |
| 7 | 4.4 | 0.1966 | 0.78 | 73.68 |

PIEZOELECTRIC NANOPARTICLE-POLYMER COMPOSITE STRUCTURE

CROSS REFERENCE TO RELATED APPLICATIONS

This patent document claims priority to and benefits of U.S. Provisional Patent Application No. 62/093,927, entitled "PIEZOELECTRIC NANOPARTICLE-POLYMER COMPOSITE FOAMS," filed on Dec. 18, 2014. The entire content of the above patent application is incorporated by reference as part of the disclosure of this patent document.

TECHNICAL FIELD

This patent document relates to systems, devices, and processes that provide piezoelectric materials.

BACKGROUND

Piezoelectric foam materials have been fabricated previously and are proven to show heightened sensitivity and tunability based on pore size and shape. Current iterations of this type of material are heavy, brittle and difficult to process into arbitrary shapes.

SUMMARY

Techniques, systems, and devices are disclosed for implementing fabrication of stretchable nanoparticle-polymer composite structures, such as foams that exhibit piezoelectric properties. The mechanical and electrical properties of the material can be tuned based on the level of porosity introduced as well as compositional variations such as loading fractions of nanoparticles. The disclosed stretchable nanoparticle-polymer composite structures that exhibit piezoelectric properties can have various applications including high resolution, compact ultrasonic imaging instruments; acoustic sensors; chemical sensors; mechanical actuators; biodiagnostic materials (e.g., microfluidics, small molecule force sensing); remote interfacing (e.g., acoustic detection) with portable electronics; and energy scavenging.

In one aspect, a porous nanoparticle-polymer composite structure is disclosed. The porous nanoparticle-polymer composite structure includes a cured polymer; piezoelectric nanoparticles; and graphitic carbons. The nanoparticle-polymer composite structure including the curable liquid polymer, the piezoelectric nanoparticles, and the graphitic carbons are shaped to form the porous structure.

The porous nanoparticle-polymer composite structure can be implemented in various ways to include one or more of the following features. For example, the curable liquid polymer can include polydimethylsiloxane (PDMS). The curable liquid polymer can include polyurethane. The piezoelectric nanoparticles can include BTO, PZT, ZnO, or $NaNbO_3$. The graphitic carbons can include carbon nanotubes (CNTs) or graphene. The porous structure can include a foam. The porous structure can receive an electric field that is greater than coercive field of the piezoelectric nanoparticles to render the porous structure piezelectronically active. The porous structure has a porosity up to 73%. The porous structure has an elastic moduli ranging from 248 kPa to 32 kPa.

In another aspect, a method of fabricating a porous structure having piezoelectric properties is disclosed. The method includes mixing a nanoparticle-polymer composite material with a predetermined amount of sugar and a curing agent to form a dough; shaping the dough using molding or conformal coating techniques; curing the dough; and after curing is complete, removing the sugar to obtain the porous structure.

The method can be implemented in various ways to include one or more of the following features. For example, the nanoparticle-polymer composite material can include a curable liquid polymer; piezoelectric nanoparticles; and graphitic carbons. The method can include interfacing the porous structure with flexible electrodes; and rendered the porous structure piezelectronically active by supplying, through the flexible electrodes, an electric field that is greater than coercive field of the piezoelectric nanoparticles to the porous structure. The curable liquid polymer can include polydimethylsiloxane (PDMS). The curable liquid polymer can include polyurethane. The piezoelectric nanoparticles include BTO, PZT, ZnO, or $NaNbO_3$. The graphitic carbons can include carbon nanotubes (CNTs) or graphene. The method can include adjusting a ratio of an amount of the nanoparticle-polymer composite material to the predetermined amount of sugar to control porosity of the porous structure. The adjusting can include adjusting the ratio to achieve the porosity of up to 73%. The nanoparticle-polymer composite material can include a piezoelectric polymer that has piezoelectric nanomaterials infused. The method can include controlling a pore size by selecting a predetermined sugar grain size.

BRIEF DESCRIPTION OF THE DRAWINGS

FIG. 1 shows schematics of the (a) capillary-action and (b) roll-out methods of creating PNPFs. Part (c) shows exemplary digital images of PNPFs created with the capillary-action method (left) and the roll-out method (middle). Part (d) exemplar scanning electron micrographs of a 50% (left) and 73% (right) PNPF fabricated from the roll-out method using the same sugar grain size.

FIG. 2 shows (a) exemplary schematic of the poling process. Not shown are the thin (~5 μm) polymer, such as PDMS layers on the Au/Ti electrode to eliminate shorting during the poling process. To increase the poling field using a static voltage the foams can be compressed. Part (b) shows exemplary cycle data for a 73% foam showing the piezoelectric output and applied force vs time as a rod is dropped (and allowed to bounce) on the foam 4 times. Part (c) shows effective piezoelectric coefficient (d33) of the PNPFs as a function of porosity.

FIG. 3 shows (a) exemplary single charge/discharge traces (7 ms each) for a 0% (neat film), 50%, 62%, and 73% porous film. The applied force is also plotted in real-time. Part (b) exemplary time difference between peak voltage and force as a function of porosity.

FIG. 4 shows (a) an exemplary power output as a function of external load for different porosity films and a neat film. A ~10 N load is being applied to the samples. Part (b) shows an exemplary plot showing the charging up of a 100 nF capacitor. The voltage and 118 Hz impulse force are plotted as a function of time.

FIG. 8 shows (a) an exemplary schematic of the Flexi-Force® sensor (Tekscan) circuit that is placed underneath the foams to record the absolute force being applied to the samples simultaneously with the piezoelectric output; and (b) an exemplary schematic of the charge amplifier used in the home-build piezo-testing apparatus.

DETAILED DESCRIPTION

Techniques, systems, and devices are described for implementing a piezoelectric nanoparticle-polymer composite blend that can be cheaply and easily processed into a variety of shapes. The final material is extremely light and stretchable while retaining excellent piezoelectric properties. The disclosed technology is applicable for any porous (foam) piezoelectric polymer that has piezoelectric nanomaterials infused.

Mechanically flexible piezoelectric materials are highly sought after when building advanced sensors, actuators, and energy scavenger devices. The most common piezoelectric materials used in applications are focused on electroceramic thin films made from lead zirconate titanate [Pb(Zr$_x$Ti$_{x-1}$)O$_3$—also known as PZT) or barium titanate (BaTiO$_3$—BTO). Although these materials can have large piezoelectric moduli (d$_{33}$; which is the induced polarization along the poled axis over the applied stress along the same axis), with PZT reaching values >300 pC/N and BTO exceeding 200 pC/N depending on ceramic type and processing conditions, as thin films they are extremely brittle and difficult to shape into highly mechanically compliant structures. Improving mechanical flexibility of piezoelectrics, and creating higher order structures, is critical for driving new applications such as biological energy harvesting, compact acoustic transducers, and in vivo biodiagnostics. Brittle electroceramics such as PZT can be made more flexible by reducing the size of the piezoelectrics and fabricating high density arrays. For example, PZT nanoribbons could be patterned on elastomers over large areas while maintaining effective piezoelectric coefficients of >100 pC/N for efficient energy scavenging devices. Similar materials could also be suspended across trenches to probe cellular deformation with nanonewton force resolution. Beyond perovskite-based ceramics, piezoelectric semiconductor oxides such as ZnO nanowire arrays have also been heavily researched for various applications including energy harvesting, electronics, and sensing. However, systems that rely on one-dimensional nanostructures to enhance mechanical flexibility limit the number of stress directions which can produce piezoelectric fields. If structures can be fabricated with higher piezoelectric symmetry (i.e., macroscopic structure is similar in all direction), and more mechanically compliant materials, the piezoelectric sensitivity may increase and thus opening up a number of applications.

Foams, which are basically intact materials with large void fractions (e.g., 50-80% air), offer a unique means of creating materials with similar structuring in all dimensions. Most foams can be considered a solid (or liquid) material with a random network of air channels. For piezoelectrics this typically involves generating ceramic materials through fused-deposition or robocasting techniques which can be refined to create well-controlled porous structures either by layer-by-layer or polymeric templating. The PZT foams have higher piezo-sensitivity, lower acoustic impedance, and high mechanical flexibility compared to their thin film counterparts, which have inspired a host of applications including wide-band hydrophones, actuators, and high-temperature filters. Although porosity enhances many of the electrical and mechanical properties of electroceramics, they are still very brittle and cannot be strained beyond a few percent. The disclosed technology provides for alternative materials that can offer high piezoelectric coefficients while maintaining elasticity and isotropic mechanical integrity, as well as cost-effective synthetic strategies.

Of the many piezoelectric material types, polymers have not been as heavily researched compared to the electroceramics but can offer many advantages over the ceramics including solution-based processability, biocompatibility, and high elasticity. The most well-known piezoelectric polymer is polyvinylidene fluoride (PVDF) which has a piezoelectric coefficient (d$_{33}$~−20 to −34 pC/N) that is about an order of magnitude smaller than PZT. Because of its electrical and mechanical properties, PVDF can be applied to a wide range of applications including non-volatile low voltage memory, hydrophones and acoustic transmitters, and implantable medical devices. To improve flexibility and integration capability, PVDF can be electrospun into fibers which has led to various energy harvesting devices. PVDF foams with similar piezoelectric coefficients to the thin films and fibers can be used to obtain efficient energy harvesters for sound. Beyond the pure polymers such as PVDF, other polymer systems are available, such as piezoelectric composites that combine electroceramic nanoparticles with a polymer matrix. For example, BTO nanoparticles could be mixed with an elastomer such as polydimethylsiloxane (PDMS) and carbon nanotubes (CNTs) to create highly flexible and efficient piezoelectric materials for energy harvesting. The CNTs in these composites can enhance the stress transfer from the polymer to the BTO nanoparticles. These types of composite materials can be optically printed into user-defined 2D and 3D microstructures with strong piezoelectric properties.

The disclosed technology can be implemented to create highly elastic piezoelectric polymers that maintain 3D structural isotropy and strong piezoelectric behavior. The disclosed technology combines simple foam processing with piezoelectric polymer composites to control the mechanical and electrical properties of the materials. Porous elastomers such as PDMS can be used for membrane separation and oil absorbent applications. Of the various fabrication techniques for producing PDMS foams, the sugar-template method provides a simple and cost effective procedure to making highly porous polymer materials. In a variant of casting methods, commercially available sugar is added to the PDMS mixture which can then be easily removed by soaking in water to leave a 3D isotropic network of air channels in the polymer. The porous materials created with this method are extremely soft with an elastic modulus of ~20 kPa which is well over an order of magnitude smaller than bulk PDMS (~750 kPa). The disclosed technology leverages similar sugar-templating strategies to fabricate piezoelectric nanoparticle-polymer composite foams (PNPFs) and correlate their porosity and mechanical properties with the piezoelectric performance of the materials.

The disclosed technology is applicable for any porous (foam) piezoelectric polymer that has piezoelectric nanomaterials infused. For example, polyurethane or PDMS can be used. The air fraction can be made by various means including templating (such as the sugar method disclosed in this patent document) or direct air (e.g., emulsion) infusion into the uncured polymer. For example, piezoelectric BTO nanoparticles can be used to make polymer active and carbon nanotubes can be used to help convert mechanical energy to electrical energy. However, the foams can include any polymer, piezoelectric nanoparticle, and other fillers.

The disclosed technology includes two variants of the foam processes. In the first method cubed sugar is placed into a mixture of PDMS loaded with 10% BTO nanoparticles (diameter ~80 nm) and 1% multiwalled CNTs (see Supporting Information for experimental details) and the solution is allowed to infiltrate the void space of the sugar via capillary action (FIG. 1, part a). Once the composite is cured, the sugar is removed by soaking the cube in boiling water. This method works well for creating large volume foam structures. However, fine tuning the porosity and generating high electric fields across the material to align the dipoles in the BTO nanoparticles without significantly compressing the material or using extremely high voltages (>10 kV) can be challenging. To better control the porosity and allow thinner films to be fabricated with higher throughput, free sugar can be added directly to the uncured polymer composite and rolled out once the proper viscosity is reached (FIG. 1, part b). The porosity is tuned by simply adding different weight percents of the sugar. For example, sugar/polymer ratios ranging from 1.8 to 4.4 produced porous structures with an air fraction of 48.8% to 73.7%, respectively (see FIG. 5). Lower porosities can be difficult to achieve since the materials would contain trapped pockets of sugar which could not be removed. The pore size is governed by the sugar grain size and can be kept constant by infusing the same sugar type regardless of the sugar/polymer ratio (FIG. 1, part d). To limit pore size distribution only fine baker's sugar can be used. Other sugar types (e.g., powdered, granulated) can be used, but may lead to inferior or unusable materials. As expected, the foam stiffness is directly related to porosity showing elastic moduli ranging from 248 kPa for the 50% porous composites to 32 kPa for the foams with 73% porosity (see FIG. 6). The composite foams show slightly higher stiffness values compared to pure PDMS foams due to the addition of BTO nanoparticles and CNTs. The foams also show excellent cyclability (see FIG. 7) without any significant change in the elastic properties after repeated strain curves (1,200 cycles). This is important for piezoelectric applications that require repeated compression or tension to generate charge and power.

Figure 1A:
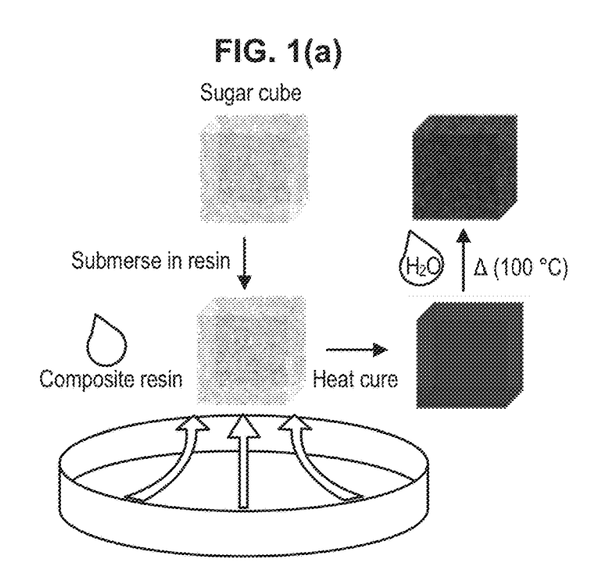
Figure 1B:
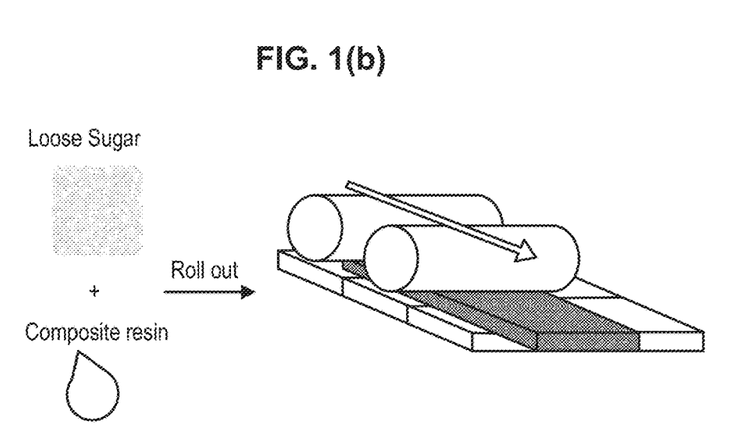
Figure 1C:
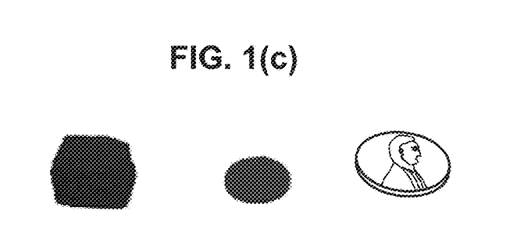
Figure 1D:
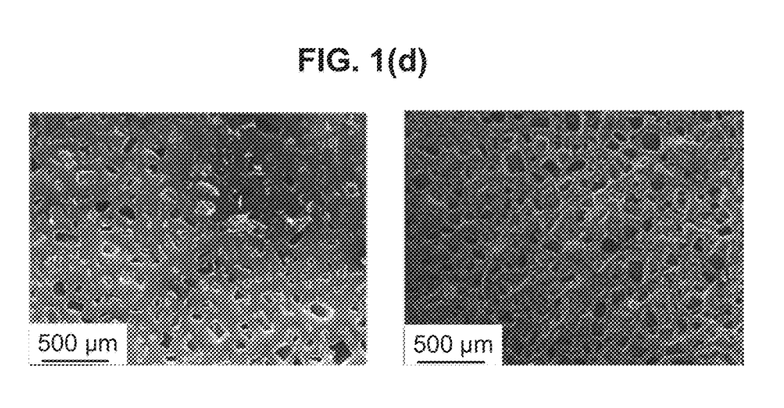
Figure 2A:
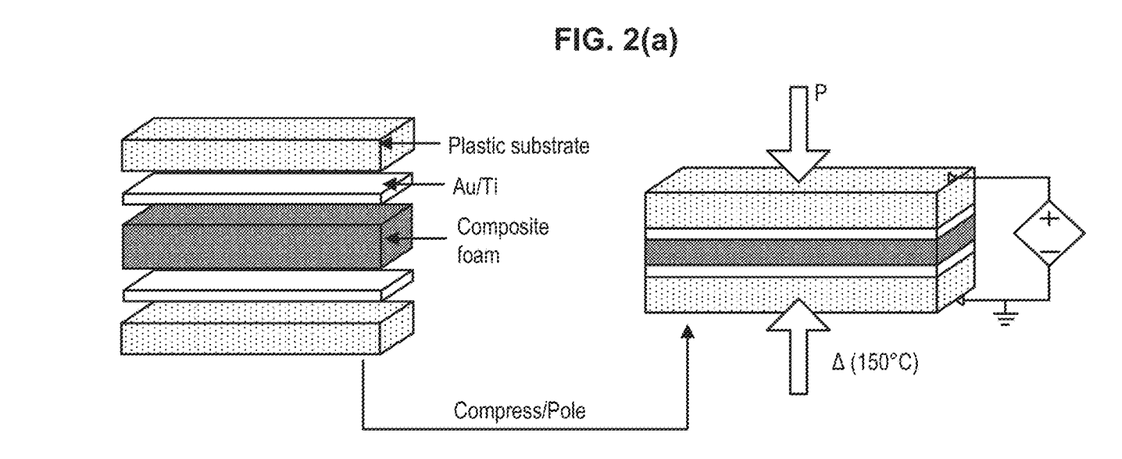
Figure 2B:
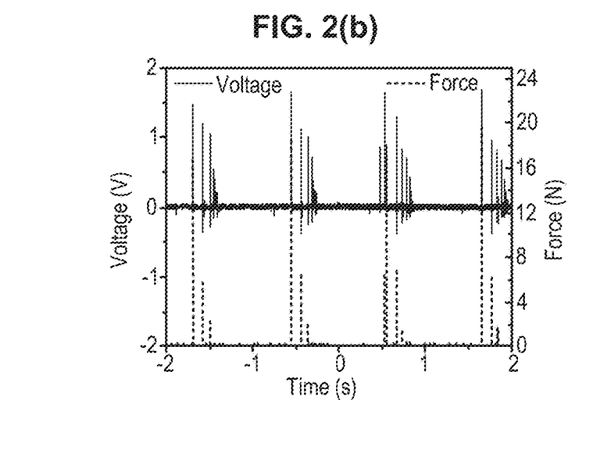
Figure 2C:
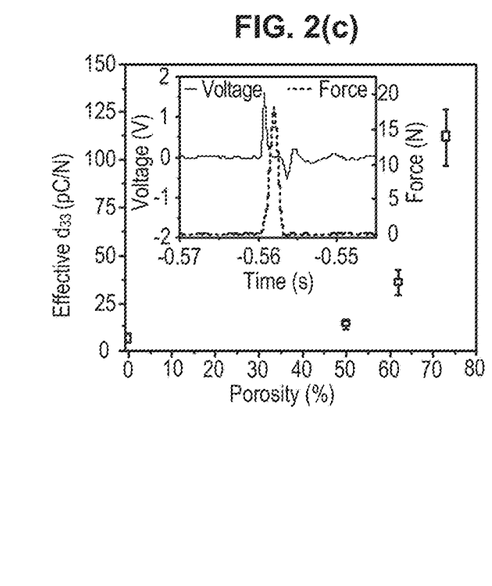

The as-made foams are only weakly piezoelectric, or show no piezoelectric properties, since the dipoles in the BTO nanoparticles are randomly oriented. To activate the material the foams must be poled in an electric field larger than coercive field (~10 V/μm) of the BTO nanoparticles. This can be achieved by depositing Au/Ti (10 nm Ti followed by 200 nm of Au) on a flexible Kapton substrate and interfacing the electrodes with the top and bottom surfaces of the foam and poling on a 150° C. hotplate for up to 15 hours to ensure a fully polarized foam (FIG. 2, part a). A thin (~5 μm) layer of cured PDMS can be placed on the metal electrode prior to contacting with the foam to help eliminate shorting during poling. The piezoelectric charge coefficient ($d_{33}$) of the individual foams can be quantified using a homemade piezoelectric test apparatus that reads out the voltage output of the material simultaneously with the applied load (see FIG. 8). The instrument can be fully calibrated using a commercial PZT film with a piezoelectric coefficient of 300 pC/N prior to testing the foams. FIG. 2, parts b,c show some cycling data of a 73% foam and the measured effective $d_{33}$ values as a function of porosity. At 0% porosity (i.e., neat film) the composites show only a weak piezoelectric coefficient of 6 pC/N but by 50% porosity the value has more than doubled, eventually reaching 112 pC/N at a porosity of 73%. The larger error in the piezoelectric coefficient (and strain rate in FIG. 3, part b) at higher porosities is likely due to an increased contribution to the electrical output from shear and/or bending modes which can slightly vary between runs when measuring a more compliant material. With only 10% loading of the BTO nanoparticles, and CNTs added to enhance the mechanical-to-electrical conversion process, these values at high porosity are significantly larger than pure polymers such as PVDF. The enhanced piezoelectric properties of the foam structure are due to a combination of effects which include being a softer material (i.e., smaller loads required to strain the material) compared to the 0% films and that the interconnected polymer matrix is helping to localize stresses on the piezoelectric nanoparticles. To boost the piezoelectric output further, various strategies can be employed such as direct grafting of the BTO nanoparticles to the polymer chains, using piezoelectric nanoparticles with higher intrinsic $d_{33}$ values (e.g., PZT), or increasing the nanoparticle loading percent.

FIG. 2 shows (a) an exemplary schematic of the poling process. Not shown are the thin (~5 μm) PDMS layers on the Au/Ti electrode to eliminate shorting during the poling process. To increase the poling field using a static voltage the foams can be compressed. Part (b) shows exemplary cycling data for a 73% foam showing the piezoelectric output and applied force vs time as a rod is dropped (and allowed to bounce) on the foam 4 times. Part (c) shows an effective piezoelectric coefficient ($d_{33}$) of the PNPFs as a function of porosity. The neat film (0% porosity) is also shown for comparison. Data points are the average of 5 measurements and the error bars are the spread in the data. (inset) Zoom in on one of the output cycles in part (b) showing the piezoelectric response of the foam as a function of time and applied force.

It is important when dealing with a high surface area materials to properly decouple the piezoelectric effects from other charge forming processes such as the triboelectric effect. When materials (e.g., polymers) with different contact charging properties are interfaced, they can produce large static-charge driven signals while in physical contact. This triboelectric effect is even further enhanced when two materials at different regions of the tribo-series are roughened and then brought together. Similar to a reduction-oxidation potential, the further the materials are away from each other on a triboelectric scale, the larger the electrostatic potentials will be when the two materials come in contact. There will be strong triboelectric effects for devices that contain a high surface area PDMS foam in contact with an electrode. The pure PDMS foams produced recordable triboelectric responses when a load is applied to the foam (see FIG. 9). When the unpoled piezoelectric composite foams are tested with pure PDMS coatings on the electrodes there are still measurable static potentials. However, the triboelectric effect could be suppressed by first poling with the pure PDMS coatings and then switching to unpoled composite layers (~5 μm thick) on the electrodes. This minimizes the difference on the tribo-scale and allowed the piezoelectric properties to be probed independently from contact charging effects.

Figure 3:
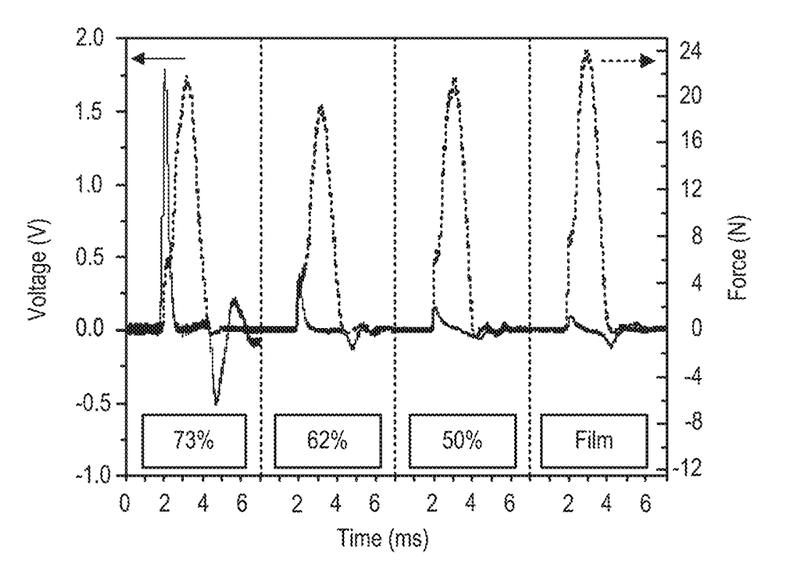
Figure 3B:
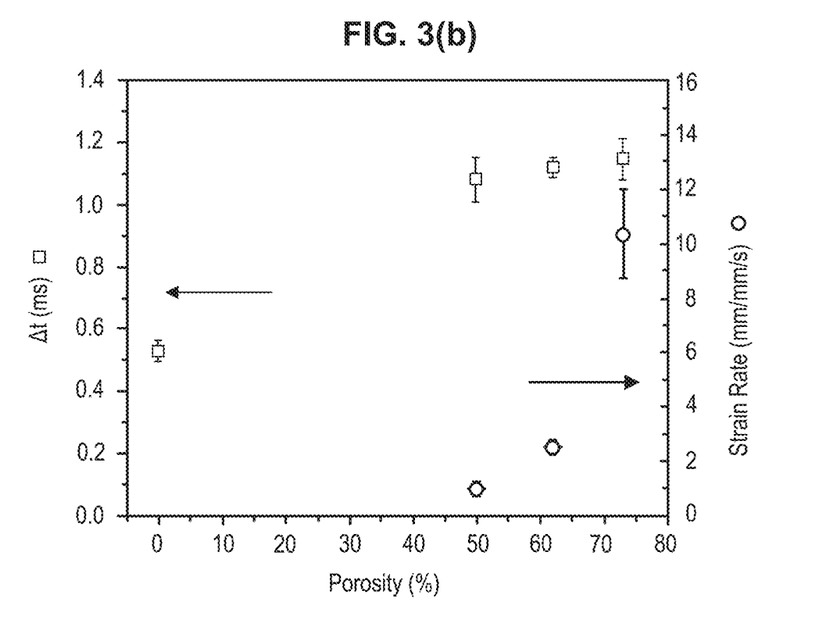

FIG. 3 shows in part (a), exemplary single charge/discharge traces (7 ms each) for a 0% (neat film), 50%, 62%, and 73% porous film. The applied force is also plotted in real-time. FIG. 3 shows in part (b), an exemplary time difference between peak voltage and force as a function of porosity. Also plotted is the compressive strain rate of the foam as a function of porosity under an ~10 N load With such large surface-to-volume ratios, the charging dynamics of the foams can be different depending on the porosity. Both the applied force and voltage output of the foam are tracked in real-time. FIG. 3, part (a) captures single charging and discharging cycle for a neat film and samples with different porosity. As force is applied to the foam, the material is compressed which strains the BTO nanoparticles, causing a recordable piezoelectric potential across the foam. For an ideal piezoelectric material (i.e., one that can efficiently hold charge over time) the voltage should peak at max force, but if charge is lost too quickly there will be an offset between the max voltage and max force. This can be clearly seen with the foams when plotting the time difference ($\Delta t$), defined as the time delay between when the max voltage and force are recorded, as a function of porosity (FIG. 3, part b). Before the maximum force is attained, the porous materials have already lost most of their charge. This suggests that the PNPFs are poor capacitors and that the piezoelectric coefficients may be underestimated for the materials. To get smaller $\Delta t$ values, higher strain rates need to be used with exemplary strain rates of up to ~10 s$^{-1}$ achieved. Strain rate and frequency can be used to tune the piezoelectric response of the PNPFs, and the electrical capacitance of the porous materials (e.g., different electrodes, foam passivation layers, etc.) could be improved. A closer look at the foam cycling curves also supports the claim of a charging/discharging process that is strongly dependent on the strain rate. For the neat film, there exists a predominant charge and discharge trace that has much better symmetry compared to the porous films. This is due to the similar strain rates during compression and recovery. However, for the foams, the charge cycle peaks at a much larger value compared to the discharge. This can be explained by the slow elastic recovery of the foam materials after compression which results in a much smaller strain rate and weaker discharge signal.

Figure 4A:
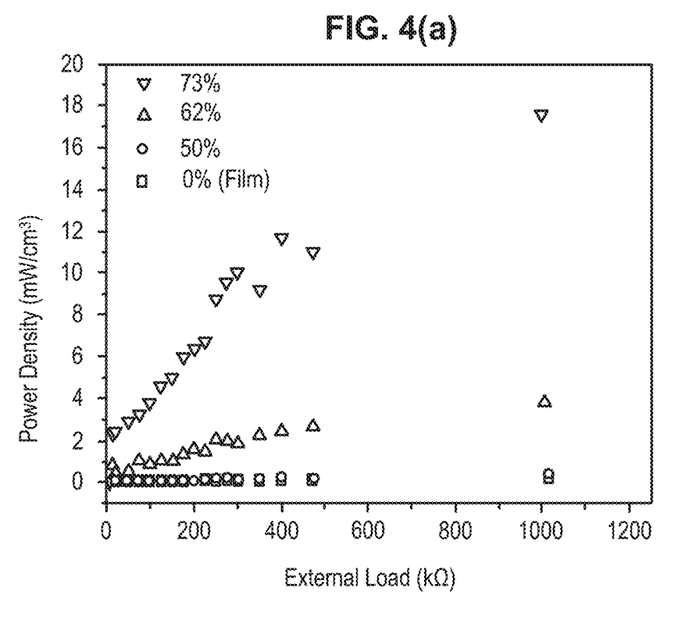
Figure 4B:
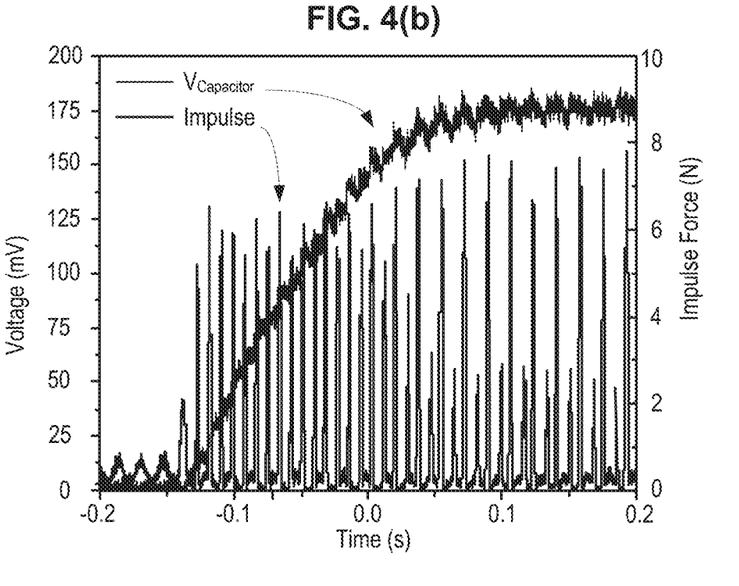

FIG. 4 shows (a) an exemplary power output as a function of external load for different porosity films and a neat film. A ~10 N load is being applied to the samples. Part (b) shows an exemplary plot showing the charging up of a 100 nF capacitor. The voltage and 118 Hz impulse force are plotted as a function of time.

The power generating capabilities of these PNPFs subject to mechanical stimulation can be understood by creating a simple circuit where the devices are connected to a potentiometer in series and the resulting power output can be measured across the external component. The foams were cycled with ~10 N loads and the resulting power densities are plotted in FIG. 4, part a. Under small external loads, the lowest power output can be seen, but once the load is increased to values above ~10 kΩ the power density steadily climbs to ~18 mW/cm$^3$ for the highest porosity samples and then plateaus. This trend fits the electronic model of an ideal capacitor which has infinite impedance. In order to maximize power transfer from the piezoelectric device to a load resistor the impedances of both must be matched. Since the foams are essentially high impedance, parallel plate capacitors with air as the dielectric, the foams will produce the highest power densities under higher electrical loads. In addition to measuring the power output under varying external loads, the PNPFs can charge up a capacitor. The device can be connected to a simple rectifying circuit, which includes a 100 nF charging capacitor, and subjected to a cycling load of ~8 N at 118 Hz. The voltage across the capacitor, and the impulse train, are recorded with time (FIG. 4, part b) and showed a maximum voltage of ~175 mV after ~200 ms. Due to the quick charging and discharging capability of the device higher frequency stimuli under smaller loads will produce faster capacitor charging times and larger voltages.

In summary, the disclosed technology utilizes simple sugar-templating methods to fabricate piezoelectric polymer composite foams. Two strategies can be implemented for creating porous piezoelectric polymers including a capillary-action and roll-out method. The roll-out process allows much finer control over the porosity, enables much thinner films, and has the potential to be scaled up to fabricate material over large areas. The mechanical studies showed the anticipated trend of lower elastic coefficients at higher porosity whereas the piezoelectric properties are significantly boosted when the air fraction is increased. Due to the large surface area of the foams, charge across the foam could not be held as efficiently as the thin films, but created a much more sensitive material. Improvements on the capacitance and discharging dynamics of the foams are attainable by leveraging different electrode interfaces, passivating layers, and/or composite materials that eliminate the CNTs. Power studies indicated that these materials can operate under mechanical loads and have enough power to drive low power devices. Given the tunable porosity, mechanical flexibility of the foams, high surface area, high piezoelectric sensitivity, isotropic microstructure, and more biocompatible chemical make-up compared to the bulk electroceramic counterparts, these foams should find immediate applications in energy scavenging platforms, biosensors, and acoustic transducers.

Exemplary Experimental Details

BTO Nanoparticles:

The BTO nanoparticles synthesis was adapted from a previously reported solvo-thermal method. In a 50 mL teflon liner 7.102 g (37.5 mmol) of barium hydroxide monohydrate (Ba(OH)$_2$—H$_2$O, 98%, Aldrich) was added to 12.5 mL of DI water and stirred at 80° C. until a slurry was formed. The liner was transferred to a glovebox (21° C., ~8% humidity) and a solution containing 8.509 g (25 mmol) of titanium-butoxide (Ti[OCH$_2$CH$_2$CH$_2$CH$_3$]$_4$, Aldrich) in 10 mL of high purity ethanol and 3.5 ml of ammonia hydroxide (28-30% NH$_3$ in water) was added. Additionally 2.5 mL of diethanolamine (HN(CH$_2$CH$_2$OH)$_2$, Aldrich) was mixed into the final solution to ensure highly tetragonal and monodisperse nanoparticles while also suppressing growth. The teflon liner was sealed in a stainless steel pressure vessel inside the glove box and placed in an oven for 16 hours at 200° C. After the reaction, the contents of the teflon liner were washed and vacuum filtered 3 times with DI water and 3 times with ethanol. The nanopowder was then vacuum dried for 24 hours before use.

Foam Synthesis:

Mixtures were made by combining 10% wt. BTO nanoparticles and 1% wt. multi-walled carbon nanotubes with polydimethylsiloxane (PDMS; Sylgard 184, Dow) similar to previous reports. To ensure a well-mixed solution, the composites were sonicated for a minimum of 5 hours. The resulting composite resin was dark gray with a slightly higher viscosity than pure PDMS. To create the foams, either a capillary-action or roll-out method was used. In the capillary-action method, and similar to previously reported techniques, a standard sugar cube was dropped into the PDMS composite and placed in a vacuum desiccator for ~2 hours After infiltration the cube was placed in an 100° C.

furnace for 10 minutes to cure the PDMS, followed by a 1 hour soak in boiling water to remove the sugar. For the roll-out method, ultrafine baker's sugar (~150 μm diameter sugar particles) was mixed into the polymer resin until a soft dough formed. The dough was placed on a sheet of Kapton film and rolled out to a desired thickness of 300-400 μm using a round teflon beaker. Ratios of 1.8 to 4.4 g sugar per gram of resin were used to achieve the desired porosities. The sheets were placed in the oven at 100° C. for 10 minutes to ensure complete curing. In order to create the foam structure the fully cured sheets were placed in boiling water to dissolve the sugar, washed in ethanol and dried in an oven at 100° C.

Electrical Measurements:

Foam materials were first activated by poling between two removable electrodes at 150° C. at a field strength of >4 V/μm for 15 hours using a 2 kV power supply. By slightly compressing the ~300 μm films during poling, fields near the coercive field (~10 V/μm) could be attained to fully polarize the BTO nanoparticles. In order to prevent dielectric breakdown during the poling process the metal electrodes were coated (via spin coating) with a thin PDMS layer (~5 μm) cured at 100° C. After the poling was completed the electrodes were removed and replaced by a new set that had a thin layer (~5 μm) of the BTO/CNT composite resin to eliminate triboelectric effects. In order to create adhesion between the foams and the electrodes the surfaces were oxygen plasma treated (Harrick Plasma chamber) prior to being placed in contact. Leads were connected to the electrodes via silver epoxy (EPO-TEK® H20E, Ted Pella) and electrical wiring. Open circuit voltage measurements of the foams were made by stacking a device on top of a force sensor (Flexiforce®, Tekscan) with a thin square of PDMS (~5 mm) in between. On top of the device, an identical square of PDMS was placed in contact with the top surface and covered with an aluminum sheet (~2 mm thick) connected to a common ground. A 21 g steel rod was dropped from a height of 5 cm and bounced on the aluminum surface to produce a signal. The lead electrode was connected to the inverting terminal of the operational amplifier and the signal was recorded by an oscilloscope (Tektronix TDS 3034). Power transfer from a device connected to an external load was measured by recording the voltage across a potentiometer in series with the device (1 kΩ, 200 kΩ, 1MΩ) according to: $P_T=V^2/R_{pot}$ where $P_T$, V, and $R_{pot}$ is the power, voltage across the potentiometer, and resistance of the potentiometer, respectively. The power density was calculated by taking the ratio of power transferred over the volume of active material in the device: $P_D=P_T/[\pi*r_f^2*t*\varphi_i]$ where $r_f$ is the radius (~5 mm) of the active area, t is the thickness (300<t<400 μm) of the foam, and $\varphi_i$ is the volume fraction of the foam, respectively. All electrical measurements were taken 5 times and the displayed data (FIG. 2, part c and FIG. 3, part b) shows the average value along with the spread of the data (error bar).

Strain Rate:

Strain rate values were calculated from the equation: $i=q/t=d_{33}E_cA(\varepsilon/t)$ where i is the current generated by the material, $d_{33}$ is the piezoelectric charge coefficient, $E_c$ is the modulus, A is the active area, and ε/t is the strain rate. Dividing the current by the charge coefficient yields the force per unit time, F/t. The strain rate can be solved using: $\varepsilon/t=(F/t)/[E_cA]$.

The values of (F/t) were calculated by taking the slope of each force curve produced during the piezoelectric testing.

Figure 5:
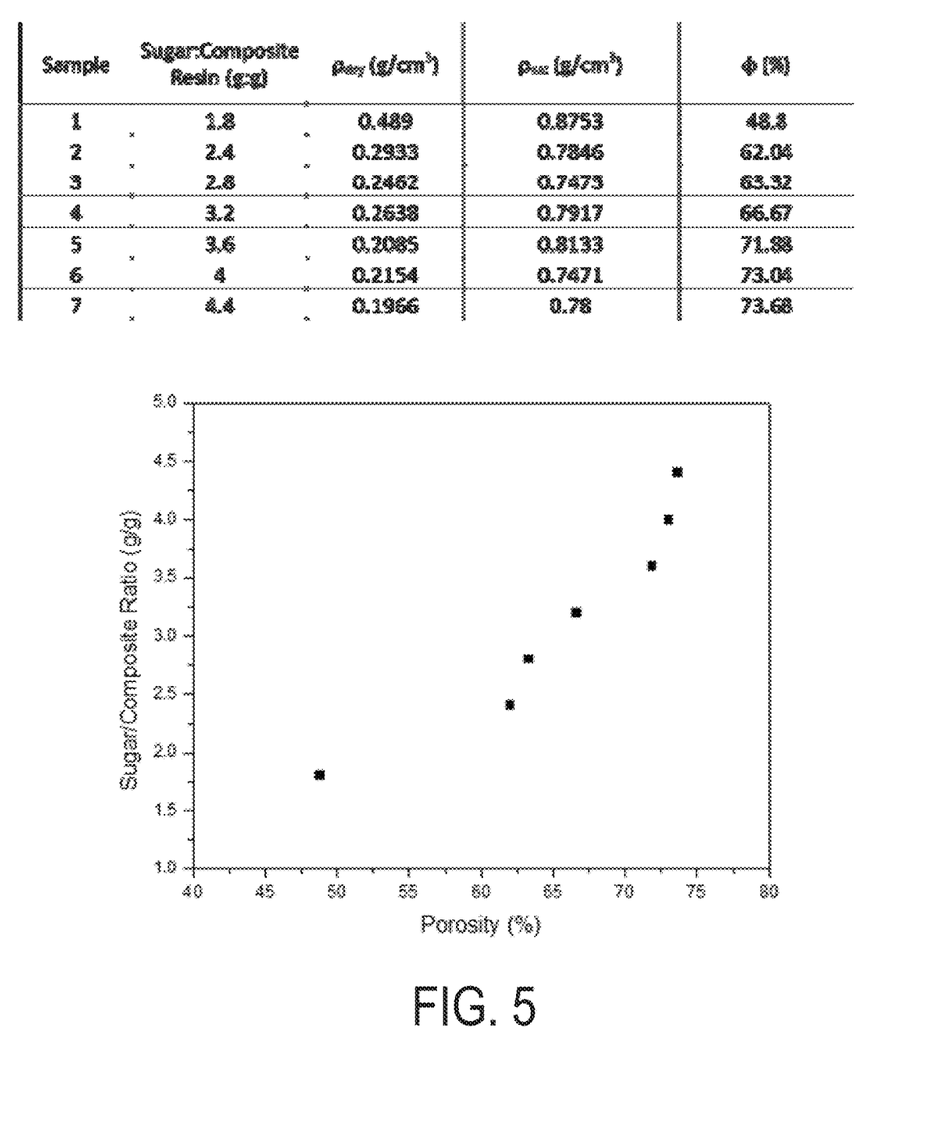
FIG. 5 shows a Table and a plot of sample porosities resulting from various sugar/polymer ratios.

FIG. 5 shows a table and a plot of sample porosities resulting from various sugar/polymer ratios. The porosities were calculated using a methanol saturation method.

Figure 6:
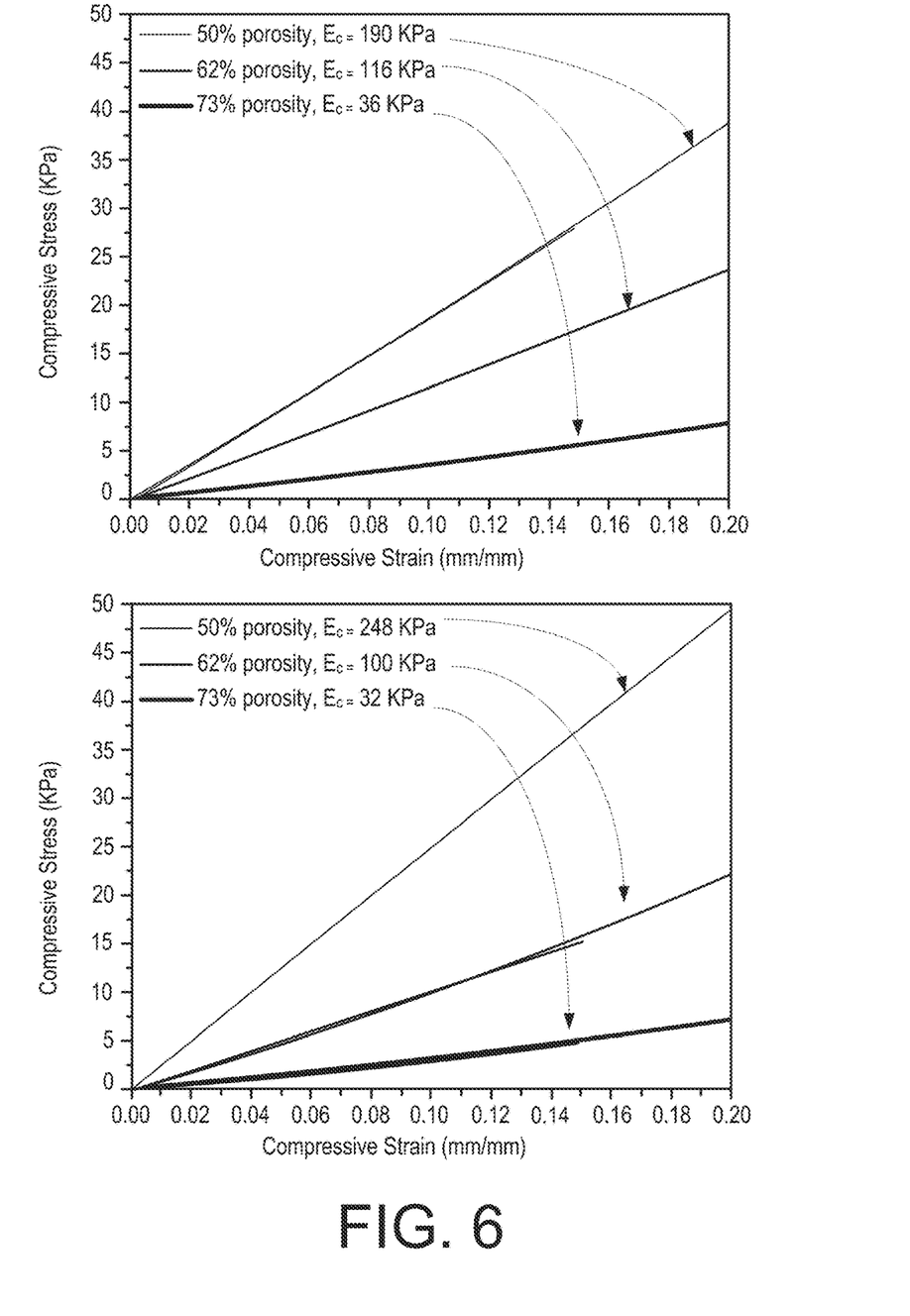
FIG. 6 shows exemplary compressive stress-strain curves of an exemplary polymer, such as pure PDMS (top) and composite (bottom) foams measured using an Instron microtester.

$\phi=[\rho_{sat}-\rho_{dry}]/\rho_{methanol}$ where $\rho_{dry}$, $\rho_{sat}$, and $\rho_{methanol}$ are the densities of the dry foam, methanol-saturated foam, and methanol, respectively. The value used for $\rho_{methanol}$ is 0.7918 g/cm$^3$ FIG. 6 shows exemplary compressive stress-strain curves of pure PDMS (top) and composite (bottom) foams measured using an Instron microtester. The samples were cubes with side lengths of 10 mm. An indentation rate 0.5 mm/s was used to compress the foams to 40% of their original heights. Compressive moduli ($E_c$) were obtained by fitting a straight line to a strain of 15%. All fits had R-squared values of 0.99.

Figure 7:
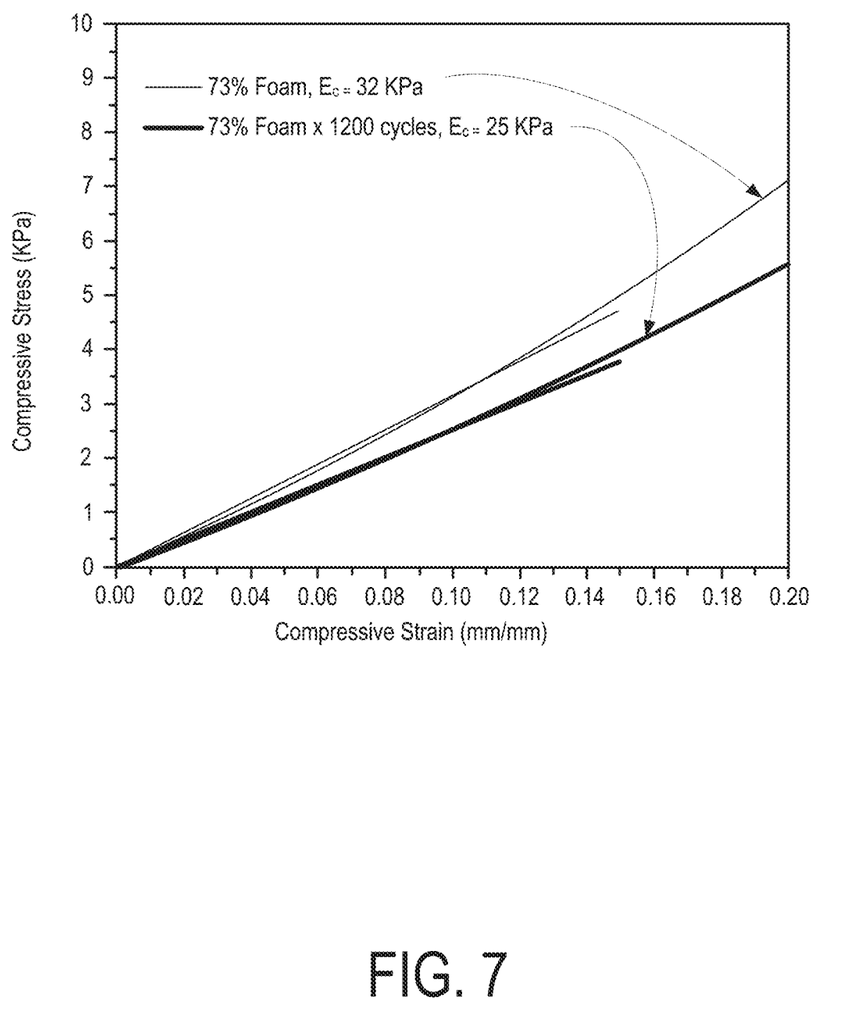
FIG. 7 shows exemplary cycling data obtained from a 73% porous composite foam. The sample was repeatedly compressed 1,200 times with a 10 N load.

FIG. 7 shows exemplary cycling data obtained from a 73% porous composite foam. The sample was repeatedly compressed 1,200 times with a 10 N load. Stress-strain curves were taken before and after the cycling.

Figure 8:
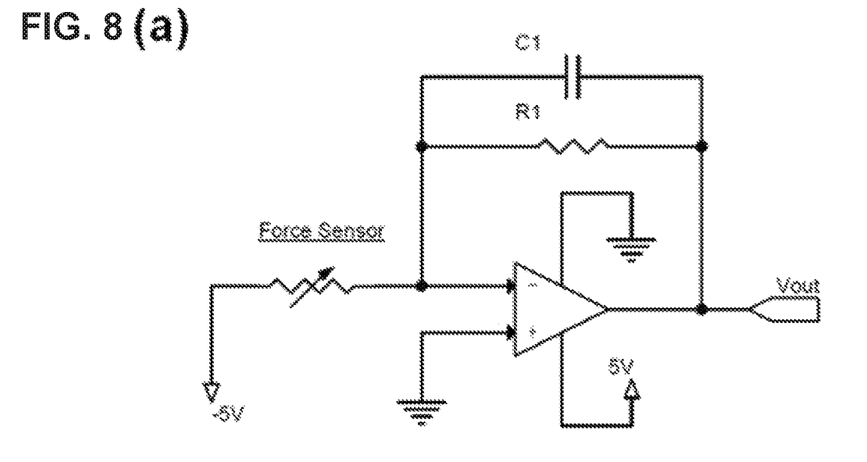

FIG. 8 shows (a) an exemplary schematic of the Flexi-Force® sensor (Tekscan) circuit that is placed underneath the foams to record the absolute force being applied to the samples simultaneously with the piezoelectric output. The output voltage of the sensor is tunable by changing the supply voltage and the feedback resistor, $R_1$. The capacitor, $C_1$, was used as the bypass capacitor. The force sensor was calibrated by placing known loads and measuring the voltage output. Under the most sensitive configuration (−5 V supply; R1=10 kΩ) the sensor shows a linear relationship with respect to load above 2 N. Part (b) shows an exemplary schematic of the charge amplifier used in the home-build piezo-testing apparatus. Charge generated from the piezoelectric foams is transferred to the reference capacitor, $C_1$, which produces an output voltage, $V_{out}$, that is equal to the voltage across $C_1$ (i.e., $V_c=-Q_{generated}/C_1$). For the experiments with the foams, a 100 pF reference capacitor and a 20 MΩ feedback resistor, R1, were used allowing the effective piezoelectic coefficient, $d_{33}$, to be calculated from $d_{33}=V_{out}\times 100$ pF/$F_{applied}$.

Figure 9:
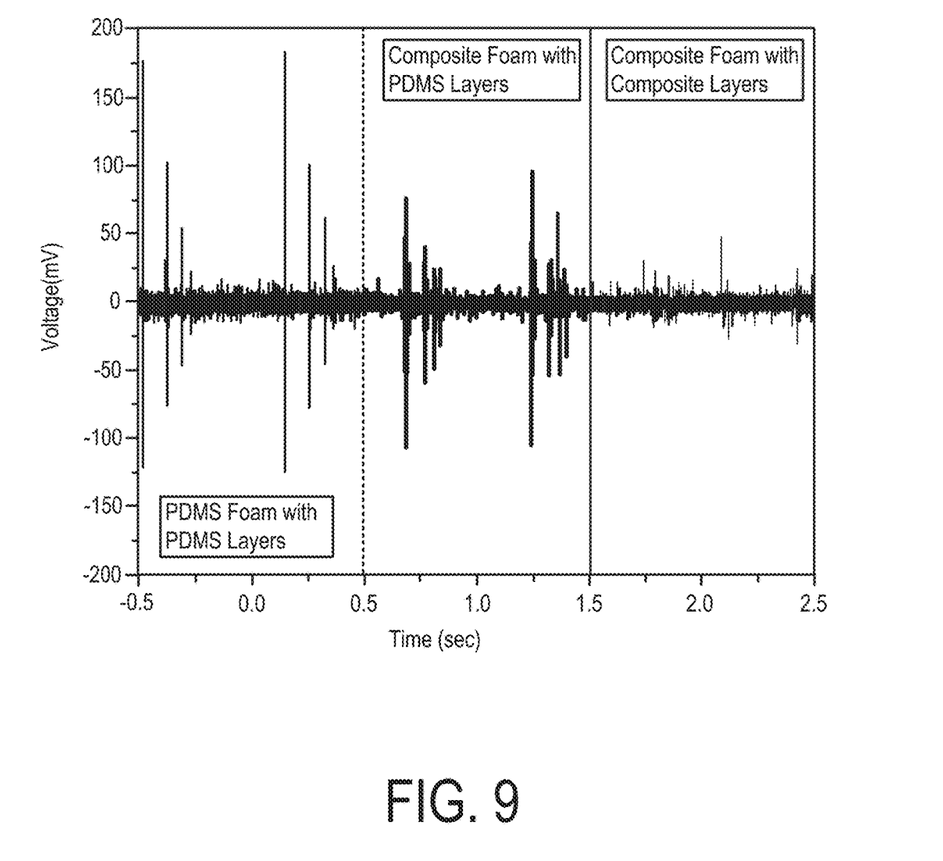
FIG. 9 are plots showing the electrical response of various electrode/sample interfaces to understand the effects of contact, or static, charge generation (i.e., triboelectric effect)

FIG. 9 shows exemplary plots showing the electrical response of various electrode/sample interfaces to understand the effects of contact, or static, charge generation (i.e., triboelectric effect). Three devices were fabricated using either a thin (~5 μm) PDMS layer or composite resin on the electrodes and then interfacing these with the pure PDMS or composite foam. To ensure that the recorded voltages were purely due to the triboelectric effect, the foam samples were not subjected to poling fields. Each data set shows a drop test where an ~10 N load was dropped on the device and allowed to bounce sequentially on the surface. By using the composite resins on the electrodes, instead of pure PDMS, it was found that the static charges could be eliminated which allowed us to decouple the piezoelectric and triboelectric effects. All data shown in the main text was captured solely from the piezoelectric response of the foams.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed are techniques and structures as described and shown, including:

1. A porous nanoparticle-polymer composite structure comprising:
a cured polymer;
piezoelectric nanoparticles; and
graphitic carbons,
wherein the nanoparticle-polymer composite structure is cured into a shape from a mixture including a curable liquid polymer, the piezoelectric nanoparticles, and the graphitic carbons.

2. The porous nanoparticle-polymer composite structure of claim 1, wherein the curable liquid polymer includes polydimethylsiloxane (PDMS).

3. The porous nanoparticle-polymer composite structure of claim 1, wherein the curable liquid polymer includes polyurethane.

4. The porous nanoparticle-polymer composite structure of claim 1, wherein the piezoelectric nanoparticles include (BTO), zirconate titanate (PZT), zinc oxide (ZnO), or sodium niobite ($NaNbO_3$).

5. The porous nanoparticle-polymer composite structure of claim 1, wherein the graphitic carbons include carbon nanotubes (CNTs) or graphene.

6. The porous nanoparticle-polymer composite structure of claim 1, wherein the porous structure is configured to receive an electric field that is greater than coercive field of the piezoelectric nanoparticles to render the porous structure piezoelectric.

7. The porous nanoparticle-polymer composite structure of claim 1, wherein the porous nanoparticle-polymer composite structure has a porosity with a value up to 73%.

8. The porous nanoparticle-polymer composite structure of claim 1, wherein the porous nanoparticle-polymer composite structure has an elastic modulus with a value ranging from 248 kPa to 32 kPa.

9. A method of fabricating a porous structure having piezoelectric properties, the method comprising:
mixing a nanoparticle-polymer composite material with sugar and a curing agent to form a dough;
shaping the dough into a geometric shape;
curing the shaped dough; and
after curing is complete, removing the sugar to obtain the porous structure.

10. The method of claim 9, wherein the nanoparticle-polymer composite material includes:
a curable liquid polymer.

11. The method of claim 9, wherein the nanoparticle-polymer composite material includes:
piezoelectric nanoparticles.

12. The method of claim 9, wherein the nanoparticle-polymer composite material includes:
graphitic carbons.

13. The method of claim 9, comprising:
interfacing the porous structure with electrodes; and
rendering the porous structure piezoelectric by supplying, through the electrodes, an electric field that is greater than a coercive field of the piezoelectric nanoparticles in the porous structure.

14. The method of claim 10, wherein the curable liquid polymer includes polydimethylsiloxane (PDMS).

15. The method of claim 10, wherein the curable liquid polymer includes polyurethane.

16. The method of claim 11, wherein the piezoelectric nanoparticles include BTO, PZT, ZnO, or $NaNbO_3$.

17. The method of claim 12, wherein the graphitic carbons include carbon nanotubes (CNTs) or graphene.

18. The method of claim 9, including:
adjusting a ratio between an amount of the nanoparticle-polymer composite material to an amount of the sugar to control porosity of the porous structure.

19. The method of claim 18, wherein the adjusting includes adjusting the ratio to achieve the porosity of up to 73%.

20. The method of claim 9, wherein nanoparticle-polymer composite material includes a piezoelectric polymer that has piezoelectric nanomaterials infused therein.

21. The method of claim 9, including:
controlling a pore size by selecting a sugar grain size.

22. The method of claim 9, wherein the dough is shaped using molding techniques.

23. The method of claim 9, wherein the dough is shaped into a conformal coating to an object.

24. The method of claim 9, wherein the sugar is removable by soaking in water.

25. The porous nanoparticle-polymer composite structure of claim 1, wherein the piezoelectric nanoparticles are BTO with a diameter of about 80 nanometers.

26. The method of claim 11, wherein the piezoelectric nanoparticles are BTO with a diameter of about 80 nanometers.

* * * * *

UNITED STATES PATENT AND TRADEMARK OFFICE
CERTIFICATE OF CORRECTION

PATENT NO. : 10,199,560 B2
APPLICATION NO. : 14/974582
DATED : February 5, 2019
INVENTOR(S) : Donald J. Sirbuly et al.

It is certified that error appears in the above-identified patent and that said Letters Patent is hereby corrected as shown below:

In the Claims

Column 11, Line 36, in Claim 4 please insert -- barium titanate -- before (BTO), and -- lead -- before zirconate titanate; Line 37, please replace "niobite" with -- niobate --.

Signed and Sealed this
Sixteenth Day of April, 2019

Andrei Iancu
*Director of the United States Patent and Trademark Office*